(12) United States Patent
Zafiris (10) Patent No.: US 8,600,696 B2
(45) Date of Patent: Dec. 3, 2013

(54) METHOD AND SYSTEM FOR DETERMINING A REACTION SIGNAL FOR A SELECTED LOCATION IN AN INFORMATION PROCESSING SYSTEM FOLLOWING THE EFFECT OF AT LEAST ONE INPUT SIGNAL

(76) Inventor: Oliver Zafiris, Düsseldorf (DE)

( * ) Notice: Subject to any disclaimer, the term of this patent is extended or adjusted under 35 U.S.C. 154(b) by 493 days.

(21) Appl. No.: 12/680,314

(22) PCT Filed: Sep. 28, 2007

(86) PCT No.: PCT/DE2007/001751
§ 371 (c)(1),
(2), (4) Date: Sep. 23, 2010

(87) PCT Pub. No.: WO2009/039799
PCT Pub. Date: Apr. 2, 2009

(65) Prior Publication Data
US 2011/0010125 A1    Jan. 13, 2011

(51) Int. Cl.
*G06F 19/00*    (2011.01)
(52) U.S. Cl.
USPC ........... 702/109; 324/307; 324/308; 324/309; 600/410
(58) Field of Classification Search
USPC .................... 702/109; 324/307–309; 600/410
See application file for complete search history.

(56) References Cited

U.S. PATENT DOCUMENTS

| | | | |
|---|---|---|---|
| 7,689,262 B2 * | 3/2010 | Kruger et al. | 600/410 |
| 2002/0034472 A1 | 3/2002 | Renshaw et al. | |
| 2002/0193684 A1 | 12/2002 | Anderson et al. | |
| 2004/0230252 A1 | 11/2004 | Kullok et al. | |
| 2007/0194776 A1 | 8/2007 | Bossche | |

FOREIGN PATENT DOCUMENTS

| | | |
|---|---|---|
| DE | 19826992 A1 | 12/1999 |
| DE | 198226993 A1 | 1/2000 |
| DE | 19846869 A1 | 4/2000 |
| DE | 19855671 A1 | 6/2000 |
| DE | 10024488 A1 | 11/2001 |
| DE | 10250379 A1 | 2/2004 |
| WO | 03077986 A1 | 9/2003 |
| WO | 2004016165 A1 | 2/2004 |

OTHER PUBLICATIONS

Thomas, Christopher G. et al., Amplitude Response and Stimulas Presentation Frequency Response of Human Primary Visual Cortex Using BOLD EPI at 4 T, MRM (1998) 40:203-209.

(Continued)

*Primary Examiner* — Jonathan C Teixeira Moffat
*Assistant Examiner* — Hien Vo
(74) *Attorney, Agent, or Firm* — McCormick, Paulding & Huber LLP (57) ABSTRACT

A method and a device for determining a reaction signal for a selected location in an information processing system (2) in response to at least one input signal ($X_{In}$) over an application period T. The effect of an input signal ($X_{In}$) on the information processing system is determined by: a) applying input signal(s) (X) to the information processing system (2), b) detecting output signal(s) ($Y_{out}$) associated with a selected location in the information processing system in response to the input signal(s) ($X_{In}$), c) forming a value set ($X_{In}$, $Y_{Out}$, $Z_t$) for an output signal ($Y_{Out}$) at the selected location in response to an input signal ($X_{In}$) for a given time ($Z_t$), and d) determining the reaction signal ($Y_{OutMax}$) for the selected location.

16 Claims, 3 Drawing Sheets

(56) References Cited

OTHER PUBLICATIONS

Ozus, Bahadir et al., Rate Dependence of Human Visual Cortical Response Due to Brief Stimulation: An event-related fMRI study, Magnetic Resonance Imaging 19 (2001), 21-25.
Parkes, Laura et al., Reduced BOLD Response to Periodic Visual Stimulation, NeuroImage 21 (2004), 236-243.
Srinivasan, Ramesh et al., fMRI Responses in Medical Frontal Cortex that Depend on the Temporal Frequency of Visual Input, Exp. Brain Research, (2007) 180: 677-691.
von Eberhard Herter und Walter Röcker, Nachrichtentechnik, Carl Hanser Verlag, München Wien 1976, p. 82.
Logothetis, N.L. et al.,Neurophysiological investigation of the basis of the FMRI signal, Nature 412 (2001), p. 150-157.
Kumar, A., Rajapakse.J.C., Time-frequency method based activation detection in functional MRI time-series, Lecture notes in computer science 4774 (2007), Springer Berlin Heidelberg 2007, p. 368-376.
Lauterbur, P.C., Image formation by induced local interactions: Examples emploxing nuclear resonance, Nature, vol. 242 Mar. 16, 1973.
Mansfield, P. et al., Medical imaging by NMR, British Journal of Radiology, 50,1977,188-194.
Uusitalo, Mikko A. et al., Dynamical organization of thr human cisual system revealed by lifetimes of activation traces, Neuroscience Letters 213 (1996) 149-152.
Schwabl, F., Advanced quantam mechanics, Berlin Heidelberg New York 2000, 98-99.
Gerthsen, Physik, Berlin Heidelberg New York 1982, 123,125-127.
Greiner, W.,Classical theoretical physics, Classical Mechanics, Point Particles and Relativity, New York 2004, 219-223.
Greiner, W.,Classical theoretical physics,Classical Electrodynamics, New York 1998, 326.
Hollemtan, A.F. et al., Inorganic chemistry, Berlin New York/San Diego London Boston New York Sydney Tokyo Toronto 2001, 153-154.
Kittel, Ch., Introduction to solid states physics, New York,Chichester ,Brisbane, Toronto, Singapore, 1980, 301-304.
Liu, L. et al., Auditory and vestibular systems, observation of quantization effects in human auditory cortex, Neuroreport vol. 9 No. 11, Aug. 1998, 2679-2690.
Weinberger, N.M. et al., Returning auditory cortex by learning: a peliminary model of receiptive field plasticity, Concepts in Neuroscience, vol. 1 No. 1, 1990,91-132.
Siemans AG, Magnets, spins, and resonances, Brochure, Erlangen 2003.
Jäncke, L. et al., A parametric analysis of the 'rate effect' in the sensorimotor cortex: a functional magnetic resonance imaging analysis in human subjects, Neuroscience Letters 252,1998, 37-40.
Fuster, J., Temporal processing, Annals of the New York Academy of Sciences, vol. 769,Dec. 1995, 173-182.
Binder, J.R. et al., Effects of stimulas rate on signal response during functional magnetic resonance imaging of auditory cortex, Cognitive Brain Research 2, 1994, 31-38.
Reichenbach et al.., Ausgewählte Kapitel bildgebender Verfahren in der Medizin, Presentation, Univ. Jena, Academic Year 2006-2007.
Levy, R. et al., High-frequency synchronization of neuronal activity in the subthalamic nucleus of parkinsonian patients with limb tremor, The Journal of Neuroscience, Oct. 15, 2000, 20(20), 7766-7775.
Lü, Z.L. et al., Humanauditory primary and association cortex having differing lifetimes for actication traces, Brain Research, 572 (1992), 236-241.
Lu, Z.L. et al.,Behavioral lifetime of human auditory sensory memory predicted by physiological measures, Science 1992, 1668-1670.
Ioannides, A. A.. et al.,et al., Magnetoencephalographic evidence of the interhemispheric asymmetry in echoic memory lifetime and its dependence on handedness and gender, Neuroimage 19 (2003), 1061-1075.
Nieuwenhuys et al., Das Zentralnervensystem des Menschen, Berlin Heidelberg New York 1979, 36-37.
Rauber Kopsch, Anatomie des Menschen-Lehrbuch and Atlas, Stuttgart New York 1987, 423-424, 431-432.
Henson R. et al., Neuroimaging evidence for dissociale forms of repetition priming, Science 2000, 1269-1272.
Maguire, R.P. et al., PET Pharmacokinectic Course Manuel, University Hospital Groningen, Aug. 31-Sep. 2, 2000.
Wikipedia, Nuklearmedizin, printed on May 5, 2010.
Magistretti, P.J. et al., Astrocytes couple synaptic activity to gluclose utilization in den brain, News in Physiological Sciences, vol. 14, Oct. 1999, 177-182.
Kandel, E.R. et al., Principals of neural science, New York 2000, 421-423.
Stevens, J.C. et al., Brightness and loudness as functions of stimulas duration, Perception and Psychophysics, 1996 vol. 1, 319-327.
Harris, R.K., Nuclear magnetic resonance spectroscopy, New York 1986, 82,95.
Rowe, J.B. et al., High-frequency synchronization of neuronal activity in the subthalamic nucleus of parkinsonian patients with limb tremor, Science 2000,1656-1660.
Büchel, C. et al., Characterizing stimulsa-response functions using nonlinear regressors in parametric fMRI experiments, Neuroimage 8, 1998, 140-148.
Viinikainen, M. et al., Nonlinear relationship between emotional valance and brain activity: Evidence of seperate negative and positive valence dimensions, Human Brain Mapping 2010, 1-11.
Herrmann, C.S. et al., Human EEG responses to 1-100 Hz flicker resonance phenomena in visual cortex and their potential correlation to cognitive phenomena, Exp Brain Res (2001) 137, 346-353.
Eusebio, A. et al., Resonance in subthalamo-cortical circuits in Parkinson's disease, Brain 2009, 2139-2150.
Rajapakse, J.C. et al., Modeling hemodynamic response for analysis of functional MRI time-series, Human Brain Mapping 6 (1998), 283-300.
Kumar, A. et al., Power spectral based detection of brain activation from fMR images, Neural Computing & Application (2007) 16, 551-557.
Shmuel A., Synaptic activity and local field potentials; Spiking and multiunit activity in: Mulert C., Lemieux L. (Ed.) EEG-fMRI: Physiological Basis, Technique, and Applications, Heidelberg Doordrecht London New York 2010, 63-66.
Draper, Norman R., Applied Regression Analysis, New York 1998, 21.
Benkert, O. et al., Kompendium der Psychiatrischen Pharmakotherapie, Berlin Heidelberg New York 2005, 2-7,225,370.

* cited by examiner

METHOD AND SYSTEM FOR DETERMINING A REACTION SIGNAL FOR A SELECTED LOCATION IN AN INFORMATION PROCESSING SYSTEM FOLLOWING THE EFFECT OF AT LEAST ONE INPUT SIGNAL

CROSS REFERENCE TO RELATED APPLICATIONS

This application claims the priority of PCT application no. PCT/DE2007/001751, which was filed Sep. 28, 2007 and of which the entire disclosure is hereby included by reference.

The present invention relates to a method and a system for determining a reaction signal in an information processing system following the effect of at least one input signal.

BACKGROUND OF THE INVENTION

The traditional method for examining unknown objects and materials, that is to say samples and sample bodies, may consist in the sample body being exposed to an effect, for example a field, a force or an electromagnetic pulse. The field or force change generated as a result is measured and serves for recognition of the properties inherent to the system. Thus, for instance, paramagnetic or diamagnetic substances are exposed to a magnetic field and the change in the magnetic field (clearly represented by the field lines thereof) then provides information about the respective type of magnetic properties of the substances. The use of force effects often serves to cause a body to vibrate, such that the vibrating body reveals its mass. If the sample changes its constitution in terms of a specific parameter, for example in terms of location and time, then it is necessary possibly to perform a plurality of experiments for the precise examination of the sample, in order to do justice to the dynamics and change of said sample. From an abstract point of view, an input signal, for example in the form of a magnetic pulse or a simple magnetic field, acts on the sample. An output signal is measured, which output signal usually has a changed value following an interaction between sample and input signal. The more complex the sample and the more dynamic its change in terms of location and time, the more extensively it is necessary to perform the examinations in the form of measurements.

Generally known examples for determining structures include spectroscopic methods. Molecular vibrations are observed in infrared spectroscopy and Raman spectroscopy. The absorption of molecules in the visible and ultraviolet spectral range is used in UV spectroscopy. Nuclear magnetic resonance spectroscopy (NMR spectroscopy) measures the interactions of magnetic fields with the atomic nuclei. Living samples can be measured and visualized with the aid of functional magnetic resonance tomography (fMRT). Activity-dependent changes in the cortical blood flow and oxygenation of the local tissue are trapped in this case. The paramagnetic or diamagnetic properties of the deoxygenated or oxygenated blood already mentioned are measured. This is an example of a highly complex and dynamic system since the amount of blood and the ratio of oxygenated and deoxygenated blood change continually and irregularly, the individual blood molecules additionally being in continuous motion. If the sample is a brain, then an obvious information processing system is also present as well. Since the overall state of the sample, that is to say the complex and—in the case mentioned—also information processing system, changes continually, the state can only be observed retrospectively. In the case of serial measurements, in particular, the time interval between the individual measurements will be chosen to be as small as possible in order to obtain the largest possible number of values and output signals. The physical methods restrict the number here. It should additionally be mentioned that the abovementioned methods are used for examining both living and inanimate samples.

The evaluations of these measurements currently always assume an average value and thus, particularly in the case of measured values that deviate greatly from one another, corrupt the end result. For example, in the case of using an MRT (magnetic resonance tomography) as measuring instrument, the evaluations do not permit both assignment to a specific location in the sample body and at the same time determination of characteristic reaction parameters such as, for instance, structure properties of the information processing system at the specific location.

OBJECT OF THE INVENTION

The object of the present invention, therefore, is to provide a method and a device which in each case ensure that a reaction signal which originates from an information processing system and which was determined with the aid of a measuring method and a measuring device, respectively, can be assigned to a specific location in said information processing system and that it is also possible to determine characteristic reaction parameters such as, for instance, structure properties of the information processing system at the specific location with the aid of said reaction signal.

This object is achieved by means of a method for determining a reaction signal ($Y_{OutMax}$) for a selected location in an information processing system following the effect of at least one input signal ($X_{In}$) on the information processing system over an application period T, wherein at least the following method steps are performed:

a) application of the input signal ($X_{In}$) or of the input signals to the information processing system, b) detection of at least one output signal ($Y_{Out}$) associated with a selected location in the information processing system, wherein the output signal is brought about as a reaction to the application of the input signal ($X_{In}$) or of the input signals, c) formation of a value set, preferably formation of triple value sets ($X_{In}, Y_{Out}, Z_t$) from the input and output signals for the selected location, wherein each given time ($Z_t$) of application in the application period T is respectively assigned an (preferably exactly one) output signal ($Y_{Out}$) for the selected location and an (preferably exactly one) input signal ($X_{In}$), and d) determination of the reaction signal ($Y_{OutMax}$) for the selected location, wherein the maximum or the minimum of the output signals ($Y_{Out}$) or a value in an interval around the maximum or the minimum of the output signals ($Y_{OutMax}$) which have the same input signal ($X_{In}$) in the application period T is selected as the reaction signal ($Y_{OutMax}$).

This object is likewise achieved by means of a correspondingly designed system and also a computer program or computer program product which operates according to the method steps of the invention. Expedient embodiments emerge from the following description.

The maximum or minimum mentioned above should be understood in the sense of a global minimum or maximum in the period T, in which case, however, a maximum during a so-called "dip" (erroneous measurement period at the beginning of the period T) should not be understood as such a maximum or minimum. Rather, extremes of this type are left out of consideration. With regard to the term "dip", see the second example further below under the heading "Examples". In this case, for instance signals from tomography, such as e.g. from magnetic resonance tomography or nuclear spin tomography, but also signals of an X-ray device can be used as input signal. However, it is now hereby possible also to consider highly complex input signals, as distinct from stimuli, which, for example, act on individual or a few atomic nuclei, electrons, protons, spins of electrons, or phonons as input signal and, for example, form the basis of NMR physics (NMR—nuclear magnetic resonance). Further possibilities will be mentioned later, but without the enumeration of examples in this document being accorded exhaustive character. A signal for which location information can also be determined, for instance an imaging signal from the devices mentioned above, is appropriate as output signal.

The application period T is generally not defined. In particular, it can preferably comprise the time duration of the reaction signal, but need not necessarily comprise that. In particular, it can also comprise not only the time duration of the reaction signal but also a subsequent period or time interval in which, however, the reaction signal has an even further effect on the information processing system. However, these are not the only possibilities; rather, the application period T is generally not defined in more specific detail.

In an especially preferred embodiment according to the present invention, this is characterized in that exactly the maximum or minimum of the output signals ($Y_{Out}$) is selected as the reaction signal ($Y_{OutMax}$) and a value in an interval $\epsilon$ around the maximum or minimum of the output signals ($Y_{OutMax}$) is not actually used for the evaluation. The selected maximum value or minimum value therefore does not lie in a range $](Y_{OutMax})+|\epsilon|[$, but rather amounts exactly to ($Y_{OutMax}$). It goes without saying that the exact maximum value or minimum value is to be preferred as the selected reaction signal, but technical limitations such as, for example, an excessively low temporal resolution when picking up the input signals are reasons for choosing an interval around the maximum or minimum of the output signals.

In a further embodiment of the present invention, the input signals are chosen in such a way that they correspond to frequencies and can accordingly also be represented as frequencies. Thus, a series of frequencies having respectively different values can be applied as input signals ($X_{In}$) to the information processing system and the latter can then bring about a set of output signals ($Y_{Out}$).

In one particular embodiment of the present invention for determining a reaction signal for a selected location in an information processing system following the application of at least one input signal ($X_{In}$) on the information processing system with an application period T, the initially detected output signals ($Y_{Out}$) are replaced partly or wholly by approximation values. By this means, measured values based on measurement errors are not taken into account at first, in order that they can then be replaced by plausible values—for instance by means of interpolation or approximation. If technically induced points of discontinuity occur in measurements, then processing of the measurement at these points may otherwise no longer be possible and it is necessary to have recourse to the above-described substitution for detection or processing of the signal profile.

In a further particular embodiment according to the present invention, the approximation values are calculated according to the following exponential function having the form:

$$f(Y_{Out}) = A + B * e^{\left(\frac{\omega}{\omega_a} + \frac{\omega^2}{\omega_{aa}}\right)} \quad (1a)$$

where $\omega$ is the frequency with respect to a stimulus feature of the input signal and $\omega_{aa}$ and $\omega_a$ are real numbers, for example positive numbers where $\omega_{aa} >> \omega_a$ (">>" means much greater than). Thus, by way of example, $\omega$ can also denote the spatial frequency of a stimulus (e.g. checkerboard), or $\omega$ can be equated with $2\pi$ divided by the value of the interstimulus interval between 2 successive (complex) stimuli which have an effect as input signals on a system. Likewise $\omega$ can also denote for example the variable $2\pi$ divided by the difference in the contrasts C of two successive visual stimuli.

In another embodiment according to the invention, the approximation values are calculated according to the following exponential function having the form:

$$f(Y_{Out}) = A - B * e^{\left(\frac{\omega}{\omega_a} + \frac{\omega^2}{\omega_{aa}}\right)} \quad (1b)$$

and A, B, $\omega_{aa}$ and $\omega_a$ are real numbers. $\omega$ is once again the frequency with respect to a stimulus feature of the input signal. For real numbers having an absolute value of $\omega_{aa} >> 1$, or an absolute value of $\omega_a >> 1$ (">>" means much greater than), for example, it is possible, in formulae (1a) and (1b), to expand the exponential term according to a Taylor series and to linearize it for example in accordance with the choice of $\omega_{aa}$ or $\omega_a$ or to represent it for example as far as the 2nd order term of the frequency $\omega$.

The formulae (1a) and (1b) constitute suitable formulae for calculating approximation values of individual triple value sets, such that the output values detected by technical errors can be rapidly identified and matched to the real output values.

In another embodiment according to the invention here, from the input frequencies and the reaction signals ($Y_{OutMax}$) respectively determined therefor, a spectrum for the selected location in the information processing system is generated, which represents the reaction signals ($Y_{OutMax}$) in relation to ascending or descending input frequency values. This embodiment can be evaluated particularly well in subsequent operations and it is also convincing in terms of its clear representation. During the creation of a spectrum, value pairs, namely those of the input frequencies with the reaction signals ($Y_{OutMax}$) assigned thereto, are arranged in such a way that the input frequencies either rise or fall in terms of their value. Such spectra can easily be represented graphically in a two-dimensional mapping. If the curve profile is followed in an arbitrary direction, then the positive or negative gradient and the degree of change thereof are clearly discernible. A possible development of the curve profile to give maxima, minima, saddle or points of inflection becomes visible in the two-dimensional mapping and reveals the input frequencies whose assigned reaction signals ($Y_{OutMax}$) are conspicuous. In some cases, a special feature, preferably in the structure of the information processing system, can be identified by means of a targeted examination of the reaction signals ($Y_{OutMax}$) at the input frequency value and in the vicinity thereof.

In another embodiment of the present invention for determining a reaction signal for a selected location in an information processing system following the application of at least one input signal ($X_{In}$) to the information processing system over an application period T, this is characterized in that a further characteristic reaction parameter is determined in addition to the spectrum for example with the aid of an algorithm for each input signal ($X_{In}$).

For an understanding of the characteristic reaction parameters, it is useful to explain the physical background of the present invention with the aid of the following model conception based on an oscillatory system in which the generation of the input signals is understood as an exciting system and the information processing system to be measured (or parts thereof) is understood as an excited system.

The sample body in the form of an information processing system is exposed to an input signal ($X_{In}$). The information processing system is thereby changed. Depending on the input signal ($X_{In}$), output signals ($Y_{Out}$) are generated in the information processing system as a result of resonance phenomena or similar phenomena. An excited total system which outputs output signals ($Y_{Out}$) is therefore involved. Said output signals ($Y_{Out}$) are generated by components intrinsic to the system and can thus be characterized by means of the system structure. If the information processing total system consists of a complicated network of different materials and cavities and structures constructed thereby, that is to say a not readily manageable number of differently reacting components, then a not readily manageable number of components which influence the output signal ($Y_{Out}$) can also be assumed. The measured values determined, that is to say the output signals ($Y_{Out}$), represent the measurement variables that are dependent on the regional structural conditions of the system.

The input signals ($X_{In}$) with their frequency representation $\omega$ generate reaction signals. If the reaction signals generated are resonance reactions, then these frequencies are called resonant frequencies $\omega_i$, where i is a consecutive natural number used to designate the individual resonant frequencies. The information processing system as a system can react to the resonant frequencies $\omega_1, \omega_2, \ldots \omega_i \ldots, \omega_n$ in the form of output signals. In most cases, however, it is not the information processing system that reacts to the individual resonant frequencies, rather it is only one or more regions of the information processing system that reacts thereto. In order that these regions can react, they must have specific structures. These structures can be characterized by specific parameters or variables; structure variables are involved, therefore, which represent characteristic reaction parameters of the associated structures within the meaning of the present invention. These structures in the information processing system react to specific resonant frequencies and can therefore be assigned to specific regions of the information processing system. This assignment can be unambiguous and actually is in many cases, thus for instance in cases of measurement on living matter, for instance on the brain.

However, since systems which are not constructed completely homogeneously can oscillate at a plurality of excitation frequencies and, as already mentioned, the individual regions can also oscillate at different frequencies, new oscillations result from these many frequencies as a result of superposition. Said new oscillations are detected by a measurement pick-up (for instance the corresponding devices of the apparatuses already mentioned) and are output as output signal ($Y_{Out}$). However, the input signal ($X_{In}$) acts on the information processing system with a certain time delay. Thus, after the input signal ($X_{In}$) has been communicated, the oscillations build up, are superposed and then decay again. This period is referred to as the application period T.

For an understanding of the background of the model conceptions explained here, the physical principles should be recalled: the most common model for representing an oscillation is that of the oscillator of the harmonic and of the anharmonic oscillator. The constrained oscillation of an oscillator is given by the following differential motion equation (cf. Walter Greiner Ed. 2004 Springer, Classical Mechanics: point particles and relativity, Chapter 21 page 220, eq. 23.20):

$$\left(\frac{d^2 x}{dt^2} + 2\gamma \frac{dx}{dt} + \omega^2 x = f\cos\omega t\right) \quad (2)$$

where $\gamma=K/m$, $\omega^2=D/m$ and $f=F/m$, where m is the mass of the body, x is the deflection of the body from the equilibrium position and t is the time. K and D are material-dependent constants and F indicates the maximum value of the excitation force. In formula (2), the first term of the left side of the equation indicates the inertial force, the second term the friction force and the third term the restoring force.

If the frequency at which the system is excited corresponds exactly to the resonant frequency $\omega=\omega_0$, then the amplitude (if the value is positive, but in both cases the square of the amplitude) of the oscillation increases, that is to say that the external force, in other words the input signal, amplifies the natural oscillation of the system. Superpositions of oscillations such as occur in the complex systems can then likewise be represented as an oscillation because they only represent the sum of all the individual oscillations. Since all the oscillations, even the aperiodic oscillations, can be described by superpositions of harmonic oscillations, the output signal can be resolved into harmonic oscillation equations with the aid of mathematical methods such as the Laplace Transform or the Fast Fourier Transform (cf. for instance, Brigham, Elber Oran, The Fast Fourier Transform, Englewood Cliffs 1974).

The Fourier Transform can be used to calculate the frequency spectrum for temporal signals. The Fourier-Transformed solution of the equation of motion (in the frequency domain) for damped oscillations, that is to say for formula (2), reads as follows:

$$F(\varpi) = \frac{1}{2\pi} k \frac{1}{\Delta\omega^2} \quad (3)$$

where
  $\Delta\omega$ denotes the difference between resonant frequency and application frequency, and
  k is a real constant.

Against this background, it may well also be possible, in principle, to reconstruct the signal profile of the input signals by inverse transformation from the spectrum of the input frequencies $\omega$ relative to the reaction signals ($Y_{OutMax}$) although—owing to a lack of knowledge of the initial conditions—the temporal relationship would be lost. That concludes the description of the model conception of an oscillatory system that facilitates understanding of the present invention.

In one very special embodiment of the present invention, further characteristic reaction parameters, preferably the resonant frequencies and/or the resonance full width at half maximum and/or the damping parameters are determined in addition to the spectra. The spectrum assigned to a location in the information processing system preferably itself already represents a characteristic reaction parameter. The same preferably also applies to the additional parameters subsequently determined therefrom. The determination of the (further) characteristic reaction parameters serves, as described above, for characterizing the structures of the information processing system and can thus possibly provide information about these structures of the information processing system. If characteristic reaction parameters are measured for different or all locations with a spatial resolution which in each case is to be chosen or can be achieved, then a possibly also multidimensional map of the information processing system with regard to the reaction parameter respectively measured is obtained, which yields a statement about a preferably three-dimensional or two-dimensional or else one-dimensional—for instance lying along a line—distribution of said reaction parameters.

The explanation of the characteristic reaction parameters will again refer to the model conception described above. As already mentioned above, the resonant frequencies are those frequencies which excite the information processing system or at least parts thereof.

The damping parameter is the parameter which describes the damping of an oscillation. Thus, the friction force acting on an oscillating system (see term 2 on the left side of the equation in formula (2)) damps the oscillation to a standstill if no additional force is expended. The damping parameter γ is directly proportional to the constant K. The latter is a constant that is only dependent on the structure variables, and is therefore suitable for determining the structure variables. The damping parameter can be determined from the spectra.

The full width at half maximum, in particular resonance full width at half maximum, which is likewise suitable for determining the structure variables, is formed from the spectrum, for instance. The full width at half maximum of a function having a maximum is the difference between the two adjacent arguments of the function for which the function values have fallen to half of the maximum. The same correspondingly applies to a minimum. The full width at half maximum can, of course, also be determined in each case in two dimensions, that is to say relative to a 3D representation as in FIG. 2, discernible there at middle level, with respect to the $Y_{Out}$-$Z_t$ plane, the $X_{In}$-$Z_t$ and the $X_{In}$-$Y_{Out}$ plane, and also other possibilities resulting therefrom. A further possibility would be the determination of the structure parameters from the graphs resulting from projection of the graph of $Y_{Out}$ onto the $X_{In}$-$Y_{Out}$ plane and the $Y_{Out}$-$Z_t$ plane, or the approximation of the projection of $Y_{Out}$ onto the $X_{In}$-$Y_{Out}$ plane by formula (1a) or (1b).

In a further particular embodiment of the present invention, at least N input signals ($X_{In}$) are communicated to the information processing system, wherein the effect of the N input signals ($X_{In}$) on the information processing system occurs with a probability $p_1$ to $p_N$, where N represents a natural number and p preferably indicates the normal distribution probability (according to Gaussian normal distribution) of the effect in the range of 0 to 1.

In a further embodiment of the present invention, the input signals are constituted so as to amplify the amplitude of the resonant frequency of the information processing system at specific locations and to attenuate it at other locations. Likewise, through a suitable choice of the input signals, the amplitude of the resonant frequency of the information processing system, or at specific locations of the overall system can be amplified, attenuated or completely suppressed. For this purpose, it is necessary merely for the suitable resonant frequency to be chosen or avoided. However, this resonant frequency is known after the evaluation of the measurement results. Matching in the sense mentioned above is then referred to as synchronization or desynchronization if the system matches its periodic or aperiodic oscillations to the periodic or aperiodic input signals.

In order to be able to control the effects of the synchronization and desynchronization particularly precisely, it is worth recommending (possibly even necessary) to communicate the input signals multiple times with different setting parameters, wherein, in other preferred embodiments according to the present invention, the frequency of the repetition rate and/or the intensity of the input signals and/or the number of repetitions can additionally be chosen freely. This ensures exact matching of the input signals to the amplitude of the resonant frequency of the examined information processing system.

Figure 2:
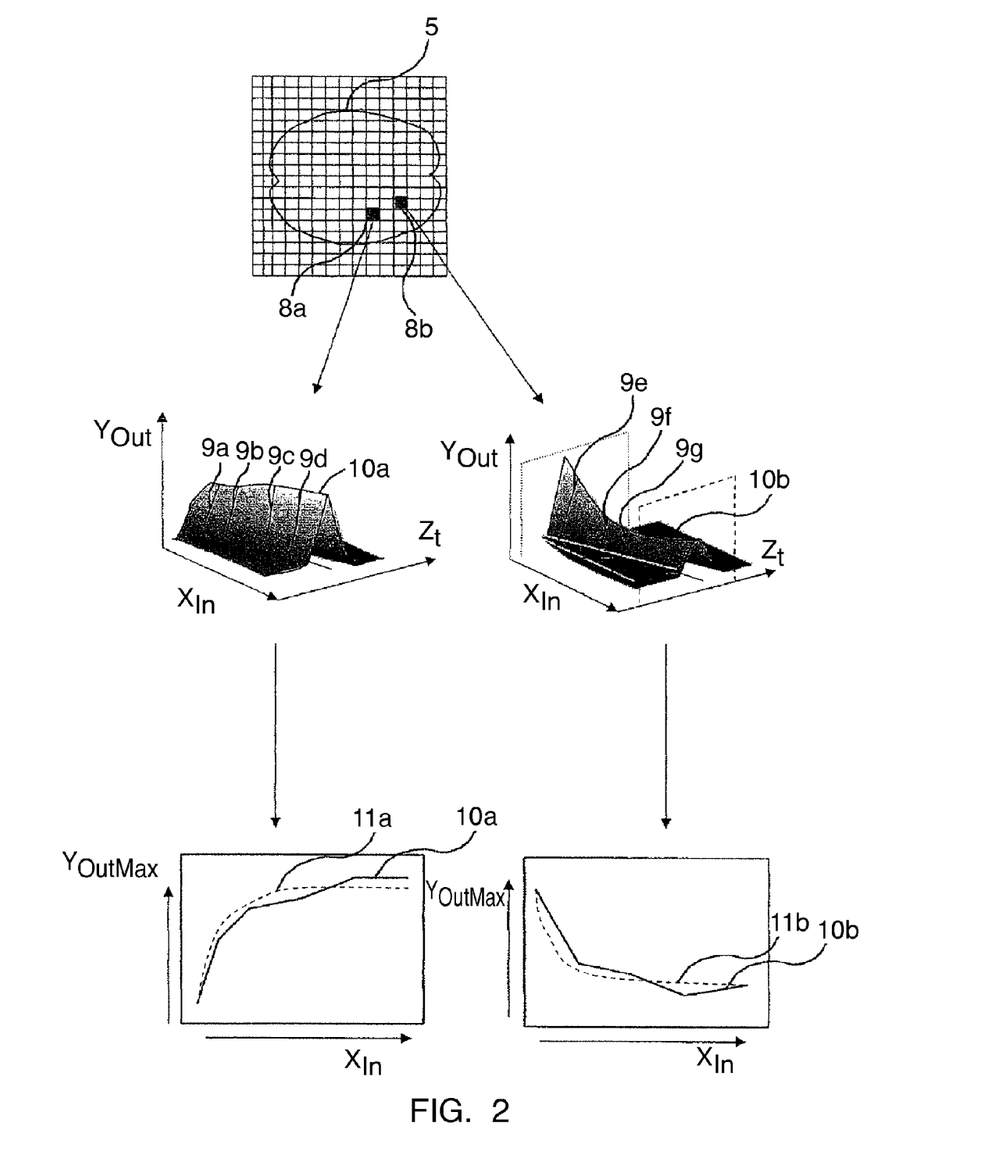
FIG. 2 shows a path of the further evaluation of the example from FIG. 1.

The measured output signals and the input signals are a temporal sequence of a finite number of signals which occur with specific frequencies. In the sense appertaining to communications technology it is unimportant whether these output signals and/or input signals can function as carriers of meaning. They represent a message, that is to say an arrangement of elements. Such an arrangement of elements has an information content, in principle. The information content of a character corresponds to the number of binary steps required for the coding. If the number of characters is written as a power to base two, then the exponent indicates the required binary steps and hence the information content in bits. The spectra obtained by means of the present invention can be represented as shown in FIG. 2, in the two lower frequency spectra therein, where the input frequencies are plotted on the horizontal axis and the output signals are plotted on the vertical axis. The input signals represent, as explained above, a message having an information content that is equal to the number of binary steps required for the coding. If the input signals are represented as logarithms of the base two, then this yields the number of information in bits (binary digits), which are transmitted to the information processing system. The output signals represent, as likewise explained above, a message having an information content. The latter is likewise equal to the number of binary steps required for the coding.

The information content of a character therefore corresponds to the number of binary steps required for the coding. The number of characters, that is to say the number of input signals or output signals, written as a power to base two, reveals in its exponent the information content of the characters in bits. Different characters, that is to say, for example, the different frequencies of the input signals or the different output signals, can occur with the same frequency or else with a different frequency. The relative frequency of a character is the quotient of its absolute frequency of occurrence and the total occurrence of all the characters. The relative frequency of a character is unambiguously related to the information content of the respective character, and so the information content of a character can correspond to the logarithm to the base two (binary logarithm) of the reciprocal value of the said relative frequency. This forms the basis for the evaluation of the information content obtained in bits with respect to the information contribution of a character to the total information content.

In one very special embodiment according to the present invention for determining a reaction signal, this is characterized in that, from the input frequencies and the reaction signals ($Y_{OutMax}$) respectively determined therefor, a spectrum for the selected location in the information processing system is generated, in which the input frequency values ($X_{In}$) are represented as logarithms of the base two.

A further particular embodiment of the present invention for determining a reaction signal is characterized in that, from the input frequencies and the reaction signals ($Y_{OutMax}$) respectively determined therefor, a spectrum for the selected location in the information processing system is generated, in which the reaction signals ($Y_{OutMax}$) are represented as logarithms of the base two.

Another embodiment according to the present invention for determining a reaction signal is then characterized in that, from the input frequencies and the reaction signals ($Y_{OutMax}$) respectively determined therefor, a spectrum for the selected location in the information processing system is generated, in which the values of the reaction signals ($Y_{OutMax}$) that are represented as logarithms of the base two and the input frequency values ($X_{In}$) are likewise represented as logarithms of base two.

This embodiment also has the advantage, moreover, of being able to obtain a statement about the information throughput at a specific location of the information processing system to be measured.

Firstly, a spectrum is generated for each location. If this spectrum is then represented as logarithms on abscissa and ordinate, in which case a straight line then typically arises, the gradient of said straight line can be determined, for instance by calculating $$\frac{Y_{OutMax}(\omega_2) - Y_{OutMax}(\omega_1)}{\omega_2 - \omega_1} \quad (4)$$

where $\omega_1$ and $\omega_2$, where $\omega_2 > \omega_1$ (or vice versa, depending on whether rising or falling frequencies were plotted on the abscissa), here are frequencies chosen for $X_{In}$, and $Y_{OutMax}(\omega_i)$ is the reaction signal for the location at the frequency $\omega_i$.

On account of the logarithms, the unit of the abscissa and ordinate values is cancelled here for the gradient since—on account of the laws of logarithms—the following holds true:

$$\frac{\log_2[\text{unit of } Y_{OutMax}] - \log_2[\text{unit of } Y_{OutMax}]}{\log_2\left[\frac{1}{s}\right] - \log_2\left[\frac{1}{s}\right]} =$$

$$\frac{\log_2\left(\frac{[\text{unit of } Y_{OutMax}]}{[\text{unit of } Y_{OutMax}]}\right)}{\log_2\left(\frac{\left[\frac{1}{s}\right]}{\left[\frac{1}{s}\right]}\right)} = 1$$

In accordance with the abovementioned relationships appertaining to information theory, a (signal) value represented as logarithms of the base two can additionally be interpreted as such a value having a specific information content in bits.

An information content in bits can thus be assigned to a specific location of the information processing system by way of the logarithms of its spectrum determined beforehand according to the invention and the determination of the gradient of the straight line obtained in the process (or approximately obtained or approximated straight line), said information content being given by the value of the gradient.

However, since the spectrum obtained for a respective location according to the invention was determined over a period T, this information content represents an information throughput for said period T. It is thus possible to determine the information throughput per unit time. By dividing by T (given in seconds) for instance, an information throughput rate in bits per second is thus obtained for example for the respective location of the information processing system. If different or all locations are measured with a spatial resolution which in each case is to be chosen or can be achieved, then a possibly also multidimensional information throughput map of the information processing system is obtained, which yields a statement about its preferably three-dimensional or two-dimensional or else one-dimensional—for instance along a line—distributed processing capacity.

The embodiments according to the invention which convert to logarithms the input frequencies and/or of the reaction signal enable, after the generation of the spectra mentioned, a direct evaluation of the information content of the communicated or detected signals and/or frequencies. In this case, it should be noted that the information content of the input signals can now be controlled practically and thus leads to an improvement in the interpretation of the evaluation of the information content of the output signals. It shall once again clearly be pointed out here that both the input values and the output values can be modified before and after processing in the above sense with the aid of a function in order thus to demonstrate meaningful parameters and constants. Such functions can be, for example, logarithmic, exponential, polynomial or else entirely different. They can also be chosen with any desired order.

For implementing the invention for determining a reaction signal for a selected location, a system is preferably used which has at least one input signal generating unit, an output signal pick-up unit and a data processing unit and also a storage device and optionally a communication interface, wherein the input signal generating unit is designed for communicating the input signal, the output signal pick-up unit is designed for picking up the output signal, and the data processing unit is designed in such a way that it can perform or performs the method according to the invention (in particular also in all the embodiments of the present invention described here). Furthermore, in a further preferred embodiment of the present invention, all values or signals obtained while carrying out the method, in particular the reaction signals and further relevant values and/or signals and/or data, can be represented partly or in totality, or are represented partly or else in totality, in imaging fashion on a monitor. Depending on the purpose of the data and signal representation, it is possible to be able to freely choose the form of representation of the respective values, data or signals one-dimensionally, for instance on a line, or two-dimensionally, that is to say for instance on a sectional area or else in two-dimensional projection of a three-dimensional representation. Moreover—given the choice of a corresponding image display device—a three-dimensional representation, for instance a holographic representation, can be used. Such three-dimensional representations also include so-called pseudo-3D representations such as are used, for instance, in the context of so-called virtual reality representations and/or moreover as a result of optical illusion effects, e.g. by means of special spectacles.

The present invention can also be present as a correspondingly designed computer program, (for instance with the program code means required for this purpose) for instance on a data carrier, for instance magnetic or optical data carriers, such as e.g. floppy disk, CD or DVD, or else without a data carrier, for instance on a carrier signal, e.g. for download purposes, wherein the computer program executes the method according to the present invention if it runs on a computer or sets up the abovementioned system according to the invention.

Finally, it should be pointed out here that information processing systems in the sense of the present invention should be understood to mean, for example, living microporous sponge systems, microchips which are constructed in three-dimensional fashion and are constructed in a topologically complicated fashion in terms of their design, e.g. by means of an X-ray device, and also living tissue, in particular tissue through which blood flows, such as the brain, for example, without this enumeration being understood as exhaustive. Input signals ($X_{In}$) can be all signals which change the sample (the information processing system). Thus, electrical and magnetic pulses, voltage changes, that is to say generally all changes in the electromagnetic field of longer or shorter duration, are effective input signals ($X_{In}$); output signals ($Y_{Out}$) are all signals which can be picked up, that is to say measured, with the aid of measuring instruments. These include, of course, all changes in the electromagnetic field, that is to say oscillation changes. However, they also include optical, thermal, olfactory or acoustic signals which can be picked up by the information processing system, and this is likewise without such an enumeration being understood as exhaustive.

The present invention can find application, then, for a series inter alia of the information processing systems mentioned above. Consequently, reaction signals from selected locations of the brain can therefore be detected and evaluated by means of this invention.

EXAMPLES

The present invention will now discussed with the aid of an example, which should be understood as non-restrictive.
Example of an Arrangement: Information Processing System/Input Signal/Output Signal In this example, the information processing system is an organic system through which blood flows, namely the brain. Said brain is intended, then, to be examined with the aid of highly complex input signals, as distinct from stimuli, which, for example, act on individual atomic nuclei, electrons, protons, spin of electrons or protons as a system as an input signal, and form the basis of NMR physics or solid-state physics. In principle, such highly complex input signals are, for example, the following signals, namely visual, olfactory, tactile and auditory signals, and also signals as a result of pharmacological substances being taken and signals as a result of a simple spoken request. In this specific case the input signals are picked up and processed as input information signals by the brain. During the cognitively stimulated process, the brain represents a system which incurs changes which are regionally characterized by characteristic resonance phenomena and structure variables. The response, that is to say the reaction of the brain, can be measured by means of measuring devices. Thus, by way of example, susceptibility changes, or changes in magnetic signals, electrical signal changes, manual, linguistic, vegetative, mechanical reactions represent the output signal.

The brain as an overall system is highly complex and the structural conditions present are dependent on the number of cell layers, the different types of synapses and their receptors, in particular the manner in which the respective brain region is coupled to other regions. In other words thus also on the number of axons and dendrites, and also the number of fibers joining and leaving a cell region. This describes the not readily manageable number of influencing components which influence the output signal. However, the measured output signals are reflected here in the relatively few structure values and characterize a brain region. The brain regions stimulated by the resonant frequency are then allocated the resonant frequencies, for example, as structure variables.

Example of the Creation of a Spectrum from Measured Data

This example describes the possible procedure from the output signals ($Y_{Out}$) that have already been detected and are associated with a selected location through to a spectrum. The triple value sets ($X_{In}$, $Y_{Out}$, $Z_t$) are then formed from the input signals ($X_{In}$) present, the detected output signals ($Y_{Out}$) and the time ($Z_t$) of application, each given time ($Z_t$) of application in the effect period T respectively being assigned exactly one output signal ($Y_{Out}$), namely ($Y_{Out}$) for the selected location, and exactly one input signal ($X_{In}$).

This entire triple value set can clearly be visualized in a 3D diagram for a respective location of the information processing system. Given a constant input signal ($X_{In}$), in particular a constant frequency close to one of the resonant frequencies $\omega_i$ of the information processing system, the curve shape generally has at least one global maximum or one global minimum. A simplified model conception elucidates the curve profile as follows: after the input signal ($X_{In}$) has been communicated, the information processing system picks up the signal. With a time delay, individual regions and/or structure elements react to said signal by virtue of the fact that the individual regions and/or structure elements then amplify or attenuate their natural oscillation and thus generate the output signal ($Y_{Out}$). After the interruption of the input signal ($X_{In}$), the natural oscillation decays again or possibly rises again, the time duration of the decay process or rise process likewise representing a characteristic variable for specific regions of the information processing system (regions of the sample body). If the input signal ($X_{In}$) then runs through a rising or falling frequency spectrum, this produces a multiplicity of curves which, each considered separately, assume the profile described above, and where the gradient, position, height and number of the local maxima and the full width at half maximum can, of course, be different for each curve. From said triple value sets ($X_{In}$, $Y_{Out}$, $Z_t$), the reaction signals for the respective selected location are then determined, which have the same input signal ($X_{In}$) in the effect period T. The maximum of all the output signals ($Y_{Out}$) present for a given input signal ($X_{In}$) is taken as a reaction signal ($Y_{OutMax}$) for the selected location. (However, a value near the maximum within an interval $\epsilon$ can also be chosen as the reaction signal ($Y_{OutMax}$).) For each triple value set at the times ($Z_t$) of application in the period T ($X_{In}$=fixed value, $Y_{Out}$, $Z_t$) there exists for the respective input signal ($X_{In}$) a global maximum from the set of output signals, which then represents the reaction signal ($Y_{OutMax}$) for a specific input signal $X_{In}$. If the input signal $X_{In}$ is varied over the frequency spectrum of interest, then such an output signal $Y_{OutMax}$ arises for each input signal $X_{In}$, but the time $Z_t$ associated therewith can be different for each of these maximum reaction signals ($Y_{OutMax}$). The resulting value pairs ($X_{In}$, $Y_{OutMax}$) can then in most cases be unambiguously assigned to a specific region with the respective characteristic structure variables thereof. Thus, the abovementioned spectrum (frequency spectrum) is obtained, which then, for its part, has further characteristic variables, namely also the characteristic reaction parameters for characterizing specific regions. In some cases, a so-called "dip" is produced during the measuring process. This is a signal which is based on a known or unknown error in the measurement. Said "dip" can assume a value which itself represents a global maximum or global minimum. Such a value is obviously incorrect; it usually occurs directly at the beginning of the measurement—during approximately the first 20% of the period T—and is not determined as a reaction signal ($Y_{OutMax}$) since it would corrupt the overall result.

Exemplary embodiments which should be understood as non-restrictive are discussed below with reference to the drawings, in which.

Figure 1:
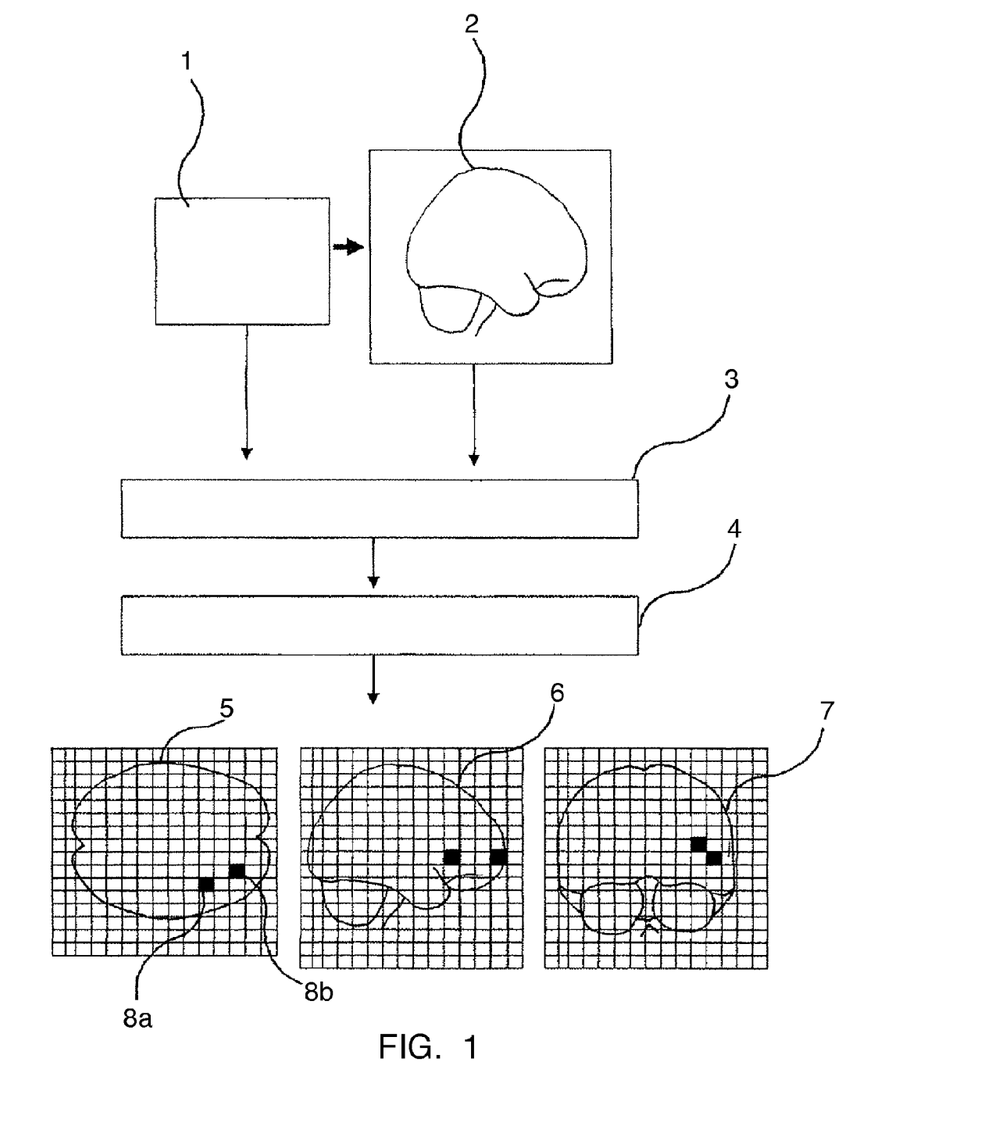
FIG. 1 shows a schematic illustration for the communication of the input signal and generation of the output signal.

FIG. 1 schematically shows the path from the communication of the input signal via the generation of the output signal through to visualization. By way of example, the brain is taken as the information processing system 2 in this case. In principle, all brain-researching imaging technical experimental devices are based on the fact that during the measuring process, that is to say after the communication of the input signal, brain signals are regarded as if they proceed in a "channel" through which they are transmitted as information and in which they are processed as information. Input signals which are processed in a brain, in particular in a human brain, are called cognitive stimuli. During a cognitively stimulated process, however, the brain then represents a system which experiences changes which are regionally characterized by characteristic resonance phenomena and structure variables. The cognitive stimulus acts on the brain and, in the stimulated regions, leads to physical changes manifested, inter alia, in a change of resonant frequencies, and so the direct description space of the detected brain processes is a frequency domain.

The information processing system 2 receives an input signal—also called stimulus—communicated from a device or a means for communicating input signals, an input signal generating unit 1. Said input signal can be visual, olfactory, tactile, auditory, taking a pharmacological substance, or even a spoken request. The brain receives the input signal and processes it as information in specific, preferably precisely determinable, brain regions. The processing process changes the brain regions involved and changes the physical properties thereof. Thus, during the information processing in the brain, the oxygen present in the blood is converted into carbon dioxide. Oxyhemoglobin becomes deoxyhemoglobin. These two types of hemoglobin have different magnetic properties which can be measured. That is to say that the reaction of the information processing system 2 can be measured by a means or a device for receiving the output signal, an output signal pick-up unit 3. Thus, by way of example, as a result of susceptibility changes, or changes in magnetic signals, electrical signal changes, and of course also as a result of manual, linguistic, vegetative, mechanical reactions, wherein the last-mentioned reactions cannot be attributed to the physical differences between oxyhemoglobin and deoxyhemoglobin. The results thus found are picked up and processed further in a device for data processing, a data processing unit 4, where they are used for visualizing the reaction centers, for example. This can be seen in the illustrations 5 to 7. The regions with detected brain activity 8a, 8b are marked. The illustrations 5 to 7 in FIG. 1 symbolize what is by far the most common prior art of cognitive imaging. In this case, in general, after linear or nonlinear regression analysis, parameters of statistical significance (P-value, t-value, F-value) are projected in color-coded fashion into the smallest spatially resolvable unit. This is the case even though, by way of example, the technique of fMRT, the technique having the highest spatial resolution capability, in cognitive studies allows as a subtler construction of the regional measurement signal in a brain region if the stimulus is changed in a manner dependent on one or two parameters, to be precise with regard to its physical stimulus properties or the stimulation interval after a defined beginning of a time interval (ISI). In current fMRT evaluation methods in the prior art, this fine structuring of the signal is not statistically examined more closely with regard to the smallest resolvable time units. Rather, averaging over the smallest temporal units is performed. FIG. 1 presents by way of example the representation of statistically significantly activated areas in comparison with a rest condition. Illustration 5 in FIG. 1 shows a transverse section, illustration 6 a saggital section, and illustration a coronal section. The reacting brain regions 8a and 8b are clearly discernible in illustration 5, for instance.

FIG. 2 schematically shows the sequence of an embodiment of the method according to the invention after pick-up and generation of the illustrations 5 to 7 according to FIG. 1, that is to say after detection of output signals which are associated with selected locations and which were brought about by the effect of input signals. It therefore shows the method steps of forming triple value sets $(X_{In}, Y_{Out}, Z_t)$ from the input and output signals and determining the reaction signal $(Y_{OutMax})$ for selected locations, wherein, from the input frequencies and the reaction signals $(Y_{OutMax})$ respectively selected therefor, a spectrum is generated, representing the reaction signals $(Y_{OutMax})$ for ascending or descending input frequency values $(X_{In})$.

This is demonstrated here by way of example on the basis of a sample examination by means of functional magnetic resonance tomography (fMRT). However, it should be pointed out again here that the method by which the measurement results are obtained is completely irrelevant to the device according to the invention and the method according to the invention. The measurement results illustrated in FIG. 2 are based, in principle, on the sequence shown in FIG. 1. The input signal, that is to say the stimulus, can vary in terms of its physical properties depending on experimental set-up or depending on measurement. The interval between the stimuli can also be variable depending on experimental set-up or measurement. This presupposes a repetition of the input signal in both cases. The interval between two stimuli presented successively is called the interstimulus interval (ISI). The measurement that has been carried out yields a large number of triple value sets $(X_{In}, Y_{Out}, Z_t)$, where $X_{In}$ represents the input signal (the stimuli, for instance normalized to $2\pi/ISI[1/s]$), $Z_t$ represents the time of the reaction for each individual input signal (that is to say the time of the measurement of $Y_{Out}$), and $Y_{Out}$ represents the output signal 3, here the level of the fMRT signal. It is clearly evident that, given a constant input signal, in particular a signal having a frequency $\omega$, corresponding to $\omega = 2\pi/ISI$, for instance close to one of the resonant frequencies $\omega_i$ of the information processing system 2 to be measured (sample body), the curve shape has a maximum. This is illustrated by way of example with the aid of highlighted measurement curves 9a to 9d of $Y_{Out}$ over the time T (that is to say at different times $Z_t$) with in each case a constant input signal $X_{In}$. After the input signal has been communicated, the information processing system 2 picks up the respective signal. Preferably with a time delay, individual regions and/or structure elements of the information processing system react to said signal by virtue of the fact that they generate an output signal, for example by virtue of the fact that the individual regions and/or structure elements then amplify, attenuate or completely suppress the amplitude of the resonant frequency and thus correspondingly generate the output signal, in this case the fMRT signal. After the interruption of the input signal, the amplitude of the output signal, for instance of the resonant frequency, decays again, wherein the time duration of the decay process can preferably represent a characteristic variable, hence a characteristic variable for specific regions of the system (regions of the sample body). If the input signal then runs through a rising or falling (frequency) spectrum, then this yields a multiplicity of curves which, each considered separately, assume the profile described above, where the gradient, position, height and number of the maxima and the full width at half maximum can be different for each measured curve. Even though in this example frequencies are always considered in a temporal dependence, frequencies, that is to say the frequencies of the input signals, should also be understood such that, by way of example, a luminescence change or a change in an arbitrary stimulus feature can represent a change in the input frequency.

For clarification purposes, FIG. 2 reveals here, by way of example, in the center of the illustration, two three-dimensional representations of the measurement results which are assigned to the two reacting brain regions 8a and 8b. The two representations differ significantly from one another. Thus, two areas of the brain which are statistically significantly activated to the same extent, that is to say the brain regions 8a and 8b, can differ in terms of their signal profile, modulated by the varied stimulus properties of a stimulus (of the input signal). The measured values of the output signal complete the triple value set $(X_{In}, y_{Out}, Z_t)$, wherein each given time $(Z_t)$ of application in the application period T is respectively assigned exactly one output signal $(Y_{Out})$ for the selected location and exactly one input signal $(X_{In})$. The reaction signal $(Y_{OutMax})$ is then formed from said triple sets, wherein the maximum of the output signals $(Y_{Out})$ which have the same input signal $(X_{In})$ in the application period T is chosen as the reaction signal $(Y_{OutMax})$, wherein $Z_t$ may indeed be different for each value pair $(X_{In}, Y_{OutMax})$. In this case, for each triple value set $(X_{In}, Y_{Out}, Z_t)$, the reaction signal $(Y_{OutMax})$ was determined and the curve profiles 10a and respectively 10b (as it were as a curve of the maxima) were thus formed. The values of this curve profile 10a or 10b have, as explained above, identical or varying $Z_t$ values. A specific region 8a or 8b with its structure variables can then be unambiguously assigned to the curve profile respectively resulting therefrom. In a projection onto the $Y_{Out}$-$X_{In}$ plane, the curve profiles 10a and 10b produce a spectrum of the $Y_{OutMax}$ values for the different $X_{In}$ values (lower part of the illustration).

If the preferred curves 10a or 10b have points of discontinuity which make it difficult for them to be determined and/or processed further, then the values $Y_{Out}$ determined from the output signal can be replaced, in a first step, by values of an approximation curve 11a or 11b, which are then preferably exchanged for selected measured values $Y_{Out}$ in a second step. By means of this method, measured values based on measurement errors are not taken into consideration at first, in order that they can then be replaced by plausible values. In this case, the approximation curve for 11a corresponding to formula (1a), for 11b corresponding to formula (1b), follows an exponential function.

Figure 3:
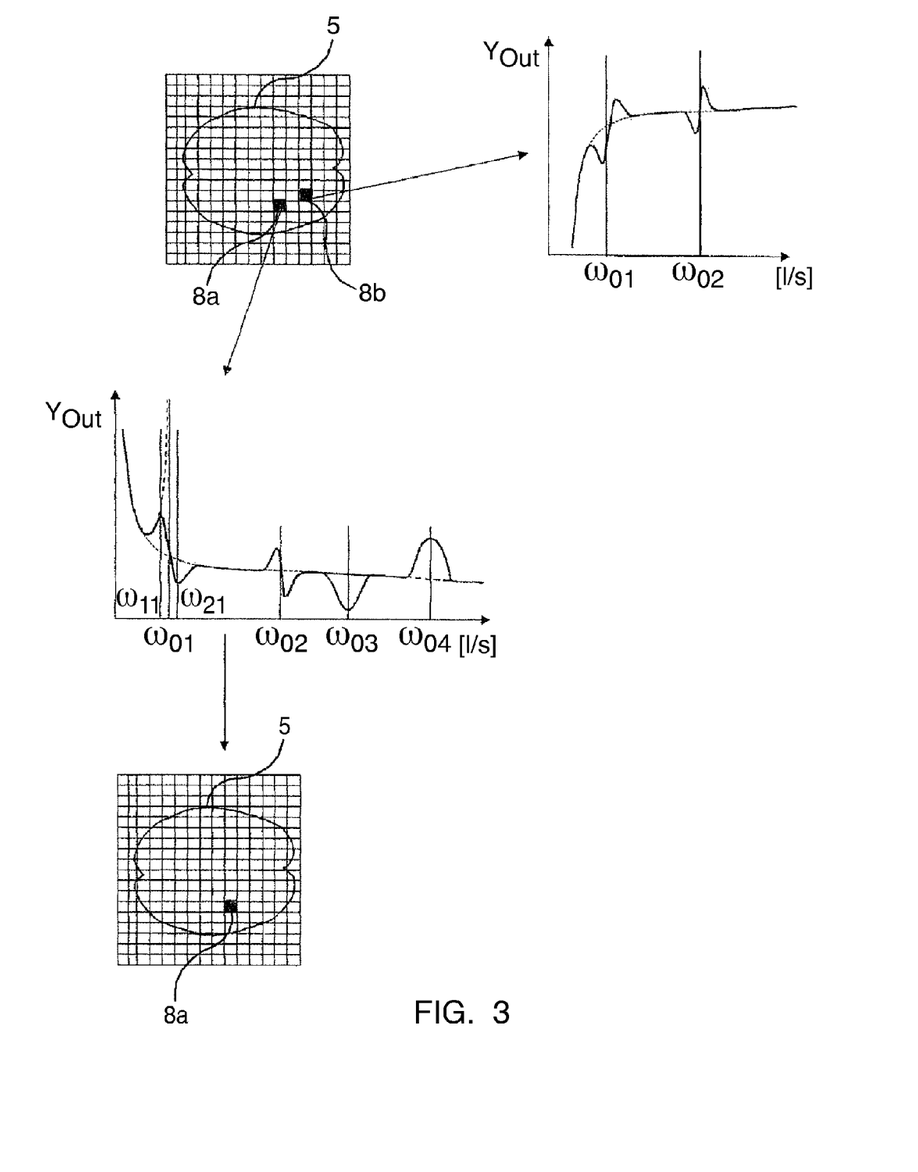
FIG. 3 shows a schematic illustration of the unambiguous assignment of the structure variables representative of the active brain regions to resonant frequencies.

FIG. 3 shows a schematic illustration of the unambiguous assignment of activated brain regions 8a, 8b to resonant frequencies. The input signals can be represented as frequencies ω. In our case, only specific frequencies, namely the frequencies $\omega_{01}$, $\omega_{02}$, $\omega_{03}$, $\omega_{04}$ generate the desired resonance reactions, which can be seen in the spectrum at the characteristic local maxima and minima. Preferably, other generated reactions of these frequencies which are possibly likewise present are not evaluated. In most cases, however, the resonant frequencies—here $\omega_{01}$, $\omega_{02}$, $\omega_{03}$, $\omega_{04}$—do not excite the overall system, but rather only one or more regions of the overall system. Here, in FIG. 3, the resonant frequencies $\omega_{01}$, $\omega_{02}$, $\omega_{03}$, $\omega_{04}$ can be assigned to the region 8a and the resonant frequencies $\omega_{01}$, $\omega_{02}$ can be assigned to the region 8b. In order that these regions 8a and 8b can react, they have to have specific structures. These structures, in turn, can be characterized by specific parameters (e.g. $\omega_a$ or $\omega_{aa}$) or variables; these are structure variables which represent characteristic reaction parameters of the associated structures within the meaning of the present invention. The structures in the information processing system thus react for example to specific resonant frequencies and can thus be assigned to specific regions of the information processing total system. This assignment is usually unambiguous. Thus, by means of the method according to the invention and the device according to the invention, it is possible to determine resonant frequencies which can be assigned to specific brain regions. These resonant frequencies therefore themselves represent characteristic reaction parameters of the associated brain regions.

The invention claimed is:

1. A method for determining a frequency spectrum and at least one resonant frequency for a selected location in an information processing system (2) in which reaction signals $(Y_{OutMax})$ for ascending or descending input frequencies of an input signal $(X_{In})$ are determined by a procedure in which the input signal $(X_{In})$, which corresponds to a stimulus that occurs with a specific frequency and acts on the information processing system (2), runs though a rising or falling frequency spectrum and in the process for each input signal $(X_{In})$ a reaction signal is determined for the selected location in the information processing system (2) following the effect of the input signal $(X_{In})$ on the information processing system (2) over an effect period T, wherein for each input signal $(X_{In})$ at least the following method steps a) to d) are performed:
    a) a data processing unit (4) determining an effect of the input signal $(X_{In})$, which is generated by an input signal generating unit (1), on the information processing system (2) during the effect period T,
    b) an output signal pick-up unit (3) detecting an output signal $(Y_{Out})$ associated with the selected location in the information processing system at different instants $(Z_t)$ during the effect period T, wherein the respective output signal is brought about as a reaction to the effect of the input signal $(X_{In})$,
    c) the data processing unit (4) forming value triples $(X_{In}$ [=constant during T], $Y_{Out}$, $Z_t)$ from the input signal, which is constant during the effect period T, and the output signals $Y_{Out}$ for the selected location, wherein each given effect instant $(Z_t)$ in the effect period T, which is the respective instant of the measurement of the respective single output signal $Y_{Out}$ is respectively assigned an output signal $(Y_{Out})$ for the selected location and the respective input signal $(X_{In})$, which is constant during the effect period T, and
    d) the data processing unit (4) determining the reaction signal $(Y_{OutMax})$ for the selected location and the respective input signal $(X_{In})$ from the value triples $(X_{In}$ [=constant during T], $Y_{Out}, Z_t)$, wherein the maximum or the minimum of the output signals $(Y_{Out})$ or a value in an interval ϵ around the maximum or the minimum of the output signals $(Y_{OutMax})$ which have the same input signal $(X_{In})$ in the effect period T is selected as the reaction signal $(Y_{OutMax})$;
    and, so the frequency spectrum with respective reaction signals $(Y_{OutMax})$ for ascending or descending input frequency values with pairs of values $(X_{In}, Y_{OutMax})$ is generated by variation of the input signal $(X_{In})$, and in addition to the spectrum thus determined, the data processing unit (4) determining at least one resonant frequency from the input signals ($X_{In}$) as a further characteristic reaction parameter for the selected location in the information processing system.

2. The method as claimed in claim 1, wherein the information processing system (2) is a brain and the output signal ($Y_{Out}$) associated with the selected location in the brain is detected by means of functional magnetic resonance tomography.

3. The method as claimed in claim 1, wherein at least one resonance full width at half maximum is determined as further characteristic reaction parameter(s) for the selected location in the information processing system (2) from the frequency spectrum.

4. The method as claimed in claim 1, wherein the time duration of the decay process of the output signal ($Y_{Out}$) is determined as further characteristic reaction parameter(s) for the selected location in the information processing system (2) for at least one specific resonant frequency.

5. The method as claimed in claim 1, wherein, for the selected location in the information processing system (2), the information throughput in bits per unit time is determined by a procedure in which the frequency spectrum determined for the selected location is logarithmized to base two both with regard to the input frequencies ($X_{In}$) and with regard to the reaction signals ($Y_{OutMax}$) obtained therefor, as a result of which typically a straight line arises, the gradient of which is determined, and the value of said gradient, divided by the effect period T, then results in the information throughput in bits per unit time.

6. A method for mapping the characteristic reaction parameters or information throughputs determined in accordance with a method as claimed in claim 1 for a selected location of an information processing system (2), wherein the respective characteristic reaction parameters or information throughputs depending on the respectively associated location are represented partly or in totality on an image display device two-dimensionally on a sectional area or in a two-dimensional projection of a three-dimensional representation.

7. The method for mapping as claimed in claim 6, wherein the respective characteristic reaction parameters or information throughputs depending on the respectively associated location are represented partly or in totality with a spatial resolution which in each case is to be chosen or can be achieved on an image display device two-dimensionally on a sectional area or in a two-dimensional projection of a three-dimensional representation wherein this representation yields a statement about a three-dimensional or two-dimensional or else one-dimensional distribution of the characteristic reaction parameter or of the processing capacity.

8. A system for determining a reaction signal for a selected location in an information processing system (2) following the effect of at least one input signal ($X_{In}$) on the information processing system (2) over an effect period T, comprising
at least one input signal generating unit (1)
at least one output signal pick-up unit (3),
at least one data processing unit (4) and
at least one storage device,
wherein the input signal generating unit (1) is designed for communicating the input signal and the output signal pick-up unit (3) is designed for picking up the output signal,
wherein the data processing unit (4) is adapted to carry out the method as claimed in claim 1.

9. The system as claimed in claim 8, wherein the system has a monitor or some other image display device.

10. The system as claimed in claim 9, wherein the system is adapted to determine characteristic reaction parameters or the information throughput per unit time for selected locations in accordance with a method for determining a frequency spectrum and at least one resonant frequency for a selected location in an information processing system (2) in which reaction signals ($Y_{OutMax}$) for ascending or descending input frequencies of an input signal ($X_{In}$) are determined by a procedure in which the input signal ($X_{In}$), which corresponds to a stimulus that occurs with a specific frequency and acts on the information processing system (2), runs though a rising or falling frequency spectrum and in the process for each input signal ($X_{In}$) a reaction signal is determined for the selected location in the information processing system (2) following the effect of the input signal ($X_{In}$) on the information processing system (2) over an effect period T, wherein for each input signal ($X_{In}$) at least the following method steps a) to d) are performed:

a) a data processing unit (4) determining an effect of the input signal ($X_{In}$), which is generated by an input signal generating unit (1), on the information processing system (2) during the effect period T, b) an output signal pick-up unit (3) detecting an output signal ($Y_{Out}$) associated with the selected location in the information processing system at different instants ($Z_t$) during the effect period T, wherein the respective output signal is brought about as a reaction to the effect of the input signal ($X_{In}$)

c) the data processing unit (4) forming value triples ($X_{In}$ [=constant during T], $Y_{Out}$, $Z_t$) from the input signal, which is constant during the effect period T, and the output signals $Y_{Out}$ for the selected location, wherein each given effect instant ($Z_t$) in the effect period T, which is the respective instant of the measurement of the respective single output signal $Y_{Out}$, is respectively assigned an output signal ($Y_{Out}$) for the selected location and the respective input signal ($X_{In}$), which is constant during the effect period T, and d) the data processing unit (4) determining the reaction signal ($Y_{OutMax}$) for the selected location and the respective input signal ($X_{In}$) from the value triples ($X_{In}$ [=constant during T], $Y_{Out}$, $Z_t$), wherein the maximum or the minimum of the output signals ($Y_{Out}$) or a value in an interval E around the maximum or the minimum of the output signals ($Y_{OutMax}$) which have the same input signal ($X_{In}$) in the effect period T is selected as the reaction signal ($Y_{OutMax}$);

and, so the frequency spectrum with respective reaction signals ($Y_{OutMax}$) for ascending or descending input frequency values with pairs of values ($X_{In}$, $Y_{OutMax}$) is generated by variation of the input signal ($X_{In}$), and in addition to the spectrum thus determined, the data processing unit (4) determining at least one resonant frequency from the input signals ($X_{In}$) as a further characteristic reaction parameter for the selected location in the information processing system;

wherein the characteristic reaction parameters or the information throughput per unit time depending on the respectively associated location in the information processing system (2) can be represented on the monitor or the other image display device.

11. The system as claimed in claim 8, wherein a tomography is provided as the output signal pick-up unit (3).

12. The use of a system as claimed in claim 11 for determining a frequency spectrum and at least one resonant frequency for a selected location in a brain (2).

13. A system for synchronization of an information processing system (2), comprising a system according to one of the claims 8 to 10 wherein the data processing unit (4) is designed to carry out a method for determining a frequency spectrum and at least one resonant frequency for a selected location in an information processing system (2) in which reaction signals ($Y_{OutMax}$) for ascending or descending input frequencies of an input signal ($X_{In}$) are determined by a procedure in which the input signal ($X_{In}$), which corresponds to a stimulus that occurs with a specific frequency and acts on the information processing system (2), runs though a rising or falling frequency spectrum and in the process for each input signal ($X_{In}$) a reaction signal is determined for the selected location in the information processing system (2) following the effect of the input signal ($X_{In}$) on the information processing system (2) over an effect period T, wherein for each input signal ($X_{In}$) at least the following method steps a) to d) are performed:
  a) a data processing unit (4) determining an effect of the input signal ($X_{In}$), which is generated by an input signal generating unit (1), on the information processing system (2) during the effect period T,
  b) an output signal pick-up unit (3) detecting an output signal ($Y_{Out}$) associated with the selected location in the information processing system at different instants ($Z_t$) during the effect period T, wherein the respective output signal is brought about as a reaction to the effect of the input signal ($X_{In}$),
  c) the data processing unit (4) forming value triples ($X_{In}$ [=constant during T], $Y_{Out}$, $Z_t$) from the input signal, which is constant during the effect period T, and the output signals $Y_{Out}$ for the selected location, wherein each given effect instant ($Z_t$) in the effect period T, which is the respective instant of the measurement of the respective single output signal $Y_{Out}$, is respectively assigned an output signal ($Y_{Out}$) for the selected location and the respective input signal ($X_{In}$), which is constant during the effect period T, and
  d) the data processing unit (4) determining the reaction signal ($Y_{OutMax}$) for the selected location and the respective input signal ($X_{In}$) from the value triples ($X_{In}$ [=constant during T], $Y_{Out}$, $Z_t$), wherein the maximum or the minimum of the output signals ($Y_{Out}$) or a value in an interval ϵ around the maximum or the minimum of the output signals ($Y_{OutMax}$) which have the same input signal ($Y_{In}$) in the effect period T is selected as the reaction signal ($Y_{OutMax}$);
    and, so the frequency spectrum with respective reaction signals ($Y_{OutMax}$) for ascending or descending input frequency values with pairs of values ($X_{In}$, $Y_{OutMax}$) is generated by variation of the input signal ($X_{In}$),
    and in addition to the spectrum thus determined, the data processing unit (4) determining at least one resonant frequency from the input signals ($X_{In}$) as a further characteristic reaction parameter for the selected location in the information processing system;
    wherein the system is adapted to determine the resonant frequency or frequencies for a selected location in an information processing system (2), where input signals ($X_{In}$) having a frequency corresponding to the resonant frequency (frequencies) determined act on the information processing system (2) multiple with different, freely selectable setting parameters, such that the intensity of the input signal, and the amplitude at the resonant frequency (frequencies) at the selected location is thus amplified.

14. A non-transitory computer readable medium storing a computer program comprising program code executed on the system as claimed in claim 13 for carrying out a method for determining a frequency spectrum and at least one resonant frequency for a selected location in an information processing system (2) in which reaction signals ($Y_{OutMax}$) for ascending or descending input frequencies of an input signal ($X_{In}$) are determined by a procedure in which the input signal ($X_{In}$), which corresponds to a stimulus that occurs with a specific frequency and acts on the information processing system (2), runs though a rising or falling frequency spectrum and in the process for each input signal ($X_{In}$) a reaction signal is determined for the selected location in the information processing system (2) following the effect of the input signal ($X_{In}$) on the information processing system (2) over an effect period T, wherein for each input signal ($X_{In}$) at least the following method steps a) to d) are performed:
  a) a data processing unit (4) determining an effect of the input signal ($X_{In}$) which is generated by an input signal generating unit (1), on the information processing system (2) during the effect period T,
  b) an output signal pick-up unit (3) detecting an output signal ($Y_{Out}$) associated with the selected location in the information processing system at different instants ($Z_t$) during the effect period T, wherein the respective output signal is brought about as a reaction to the effect of the input signal ($X_{In}$)
  c) the data processing unit (4) forming value triples ($X_{In}$ [=constant during T]($Y_{Out}$, $Z_t$) from the input signal, which is constant during the effect period T, and the output signals $Y_{Out}$ for the selected location, wherein each given effect instant ($Z_t$) in the effect period T, which is the respective instant of the measurement of the respective single output signal $Y_{Out}$, is respectively assigned an output signal ($Y_{Out}$) for the selected location and the respective input signal ($X_{In}$), which is constant during the effect period T, and
  d) the data processing unit (4) determining the reaction signal ($Y_{OutMax}$) for the selected location and the respective input signal ($X_{In}$) from the value triples ($X_{In}$[=constant during T], $Y_{Out}$, $Z_t$), wherein the maximum or the minimum of the output signals ($Y_{Out}$) or a value in an interval E around the maximum or the minimum of the output signals ($Y_{OutMax}$) which have the same input signal ($X_{In}$) in the effect period T is selected as the reaction signal ($Y_{OutMax}$);
    and, so the frequency spectrum with respective reaction signals ($Y_{OutMax}$) for ascending or descending input frequency values with pairs of values ($X_{In}$, $Y_{OutMax}$) is generated by variation of the input signal ($X_{In}$),
    and in addition to the spectrum thus determined, the data processing unit (4) determining at least one resonant frequency from the input signals ($X_{In}$) as a further characteristic reaction parameter for the selected location in the information processing system;
    wherein the system is adapted to determine the resonant frequency (frequencies) of a selected location in an information processing system (2), and input signals ($X_{In}$) having a frequency corresponding to the resonant frequency (frequencies) determined act on the information processing system (2) multiple with different, freely selectable setting parameters, such that the intensity of the input signal, and the amplitude at the resonant frequency (frequencies) at the selected location is thus amplified.

15. A system for desynchronization of an information processing system (2), comprising a system according to one of the claims 8 to 10 wherein the data processing unit (4) is designed to carry out a method for determining a frequency spectrum and at least one resonant frequency for a selected location in an information processing system (2) in which reaction signals ($Y_{OutMax}$) for ascending or descending input frequencies of an input signal ($X_{In}$) are determined by a procedure in which the input signal ($X_{In}$), which corresponds to a stimulus that occurs with a specific frequency and acts on the information processing system (2), runs though a rising or falling frequency spectrum and in the process for each input signal ($X_{In}$) a reaction signal is determined for the selected location in the information processing system (2) following the effect of the input signal ($X_{In}$) on the information processing system (2) over an effect period T, wherein for each input signal ($X_{In}$) at least the following method steps a) to d) are performed:
   a) a data processing unit (4) determining an effect of the input signal ($X_{In}$), which is generated by an input signal generating unit (1), on the information processing system (2) during the effect period T,
   b) an output signal pick-up unit (3) detecting an output signal ($Y_{Out}$) associated with the selected location in the information processing system at different instants ($Z_t$) during the effect period T, wherein the respective output signal is brought about as a reaction to the effect of the input signal ($X_{In}$),
   c) the data processing unit (4) forming value triples ($X_{In}$ [=constant during T], ($Y_{Out}$, $Z_t$) from the input signal, which is constant during the effect period T, and the output signals $Y_{Out}$ for the selected location, wherein each given effect instant ($Z_t$) in the effect period T, which is the respective instant of the measurement of the respective single output signal $Y_{Out}$, is respectively assigned an output signal ($Y_{Out}$) for the selected location and the respective input signal ($X_{In}$), which is constant during the effect period T, and
   d) the data processing unit (4) determining the reaction signal ($Y_{OutMax}$) for the selected location and the respective input signal ($X_{In}$) from the value triples ($X_{In}$ [=constant during T], $Y_{Out}$, $Z_t$), wherein the maximum or the minimum of the output signals ($Y_{Out}$) or a value in an interval E around the maximum or the minimum of the output signals ($Y_{OutMax}$) which have the same input signal ($X_{In}$) in the effect period T is selected as the reaction signal ($Y_{OutMax}$);
   and, so the frequency spectrum with respective reaction signals ($Y_{OutMax}$) for ascending or descending input frequency values with pairs of values ($X_{In}$, $Y_{OutMax}$) is generated by variation of the input signal ($X_{In}$),
   and in addition to the spectrum thus determined, the data processing unit (4) determining at least one resonant frequency from the input signals ($X_{In}$) as a further characteristic reaction parameter for the selected location in the information processing system;
   wherein the system is adapted to determine the resonant frequency or frequencies for a selected location in an information processing system (2), where input signals ($X_{In}$) whose frequency avoids that of the resonant frequency (frequencies) determined act on the information processing system (2) multiple with different, freely selectable setting parameters, such that the intensity of the input signal, and the amplitude at the resonant frequency (frequencies) at the selected location is thus attenuated or suppressed.

16. A non-transitory computer readable medium storing a computer program comprising program code executed on the system as claimed in claim 15 for carrying out a method for determining a frequency spectrum and at least one resonant frequency for a selected location in an information processing system (2) in which reaction signals ($Y_{OutMax}$) for ascending or descending input frequencies of an input signal ($X_{In}$) are determined by a procedure in which the input signal ($X_{In}$), which corresponds to a stimulus that occurs with a specific frequency and acts on the information processing system (2), runs though a rising or falling frequency spectrum and in the process for each input signal ($X_{In}$) a reaction signal is determined for the selected location in the information processing system (2) following the effect of the input signal ($X_{In}$) on the information processing system (2) over an effect period T, wherein for each input signal ($X_{In}$) at least the following method steps a) to d) are performed:
   a) a data processing unit (4) determining an effect of the input signal ($X_{In}$), which is generated by an input signal generating unit (1), on the information processing system (2) during the effect period T,
   b) an output signal pick-up unit (3) detecting an output signal ($Y_{Out}$) associated with the selected location in the information processing system at different instants ($Z_t$) during the effect period T, wherein the respective output signal is brought about as a reaction to the effect of the input signal ($X_{In}$),
   c) the data processing unit (4) forming value triples ($X_{In}$ [=constant during T], ($Y_{Out}$, $Z_t$) from the input signal, which is constant during the effect period T, and the output signals $Y_{Out}$ for the selected location, wherein each given effect instant ($Z_t$) in the effect period T, which is the respective instant of the measurement of the respective single output signal $Y_{Out}$, is respectively assigned an output signal ($Y_{Out}$) for the selected location and the respective input signal ($X_{In}$), which is constant during the effect period T, and
   d) the data processing unit (4) determining the reaction signal ($Y_{OutMax}$) for the selected location and the respective input signal ($X_{In}$) from the value triples ($X_{In}$ [=constant during T], $Y_{Out}$, $Z_t$), wherein the maximum or the minimum of the output signals ($Y_{Out}$) or a value in an interval E around the maximum or the minimum of the output signals ($Y_{OutMax}$) which have the same input signal ($X_{In}$) in the effect period T is selected as the reaction signal ($Y_{OutMax}$);
   and, so the frequency spectrum with respective reaction signals ($Y_{OutMax}$) for ascending or descending input frequency values with pairs of values ($X_{In}$, $Y_{OutMax}$) is generated by variation of the input signal ($X_{In}$),
   and in addition to the spectrum thus determined, the data processing unit (4) determining at least one resonant frequency from the input signals ($X_{In}$) as a further characteristic reaction parameter for the selected location in the information processing system;
   wherein the system is adapted to determine the resonant frequency (frequencies) of a selected location in an information processing system (2), and input signals ($X_{In}$) whose frequency avoids that of the resonant frequency (frequencies) determined act on the information processing system (2) multiple with different, freely selectable setting parameters, such that the intensity of the input signal, and the amplitude at the resonant frequency (frequencies) at the selected location is thus attenuated or suppressed.

* * * * *

UNITED STATES PATENT AND TRADEMARK OFFICE
CERTIFICATE OF CORRECTION

PATENT NO. : 8,600,696 B2  
APPLICATION NO. : 12/680314  
DATED : December 3, 2013  
INVENTOR(S) : Zafiris Page 1 of 1

It is certified that error appears in the above-identified patent and that said Letters Patent is hereby corrected as shown below:

On the Title Page, Item [57] In the Abstract:
Line 6, "X" should be replaced with --$(X_{In})$--.

In the Claims:
Claim 1, Column 16, line 36, "$(X_{In},)$" should be replaced with --$(X_{In})$--.
Claim 1, Column 16, line 48, "$Y_{Out},$" should be replaced with --$Y_{Out}$--.
Claim 1, Column 16, line 53, "$(X_{In},)$" should be replaced with --$(X_{In})$--.
Claim 10, Column 18, line 48, "E" should be replaced with --$\varepsilon$--.
Claim 13, Column 19, line 50, "$(Y_{In})$" should be replaced with --$(X_{In})$--.
Claim 14, Column 20, line 48, "E" should be replaced with --$\varepsilon$--.
Claim 15, Column 21, line 45, "E" should be replaced with --$\varepsilon$--.
Claim 16, Column 22, line 35, "$(X_{In},)$" should be replaced with --$(X_{In})$--.
Claim 16, Column 22, line 42, "E" should be replaced with --$\varepsilon$--.

Signed and Sealed this
Twenty-seventh Day of May, 2014

Michelle K. Lee
*Deputy Director of the United States Patent and Trademark Office*